United States Patent [19]
Sacher

[11] Patent Number: 5,867,512
[45] Date of Patent: Feb. 2, 1999

[54] TUNING ARRANGEMENT FOR A SEMICONDUCTOR DIODE LASER WITH AN EXTERNAL RESONATOR

[76] Inventor: Joachim Sacher, Am Kähnelplatz 8, Marburg, Germany, 35041

[21] Appl. No.: 796,459

[22] Filed: Feb. 10, 1997

[51] Int. Cl.$^6$ .............................. H01S 3/10; H01S 3/08
[52] U.S. Cl. .............................. 372/20; 372/107; 372/15
[58] Field of Search ................... 372/20, 15, 29, 372/32, 99, 102, 107

[56] References Cited

U.S. PATENT DOCUMENTS

| | | | |
|---|---|---|---|
| 5,121,398 | 6/1992 | Rao ........................................ | 372/102 |
| 5,255,273 | 10/1993 | Nilsson et al. ............................ | 372/20 |
| 5,319,668 | 6/1994 | Luecke ..................................... | 372/20 |
| 5,594,744 | 1/1997 | Lefevre et al. .......................... | 372/20 |

OTHER PUBLICATIONS

Favre et al, "82 nm of Continuous Tunability for an External Cavity Semiconductor Laser", Electronics Letters, vol. 27, No. 2, pp. 183–184, Jan. 17, 1991.

Fuh et al, "A Tunable Diode Laser", 1994 IEEE Instrumentation and Measurement Technology Conference, vol. 3, pp. 1089–90. (no month available).

*Primary Examiner*—Rodney Bovernick
*Assistant Examiner*—Quyen Leung
*Attorney, Agent, or Firm*—Klaus J. Bach

[57] ABSTRACT

In a tuning arrangement for a semiconductor diode laser which includes, in a Littman arrangement, an external resonator, an optical collimator lens system and an optical refraction grid, a tuning arm is supported on a tuning table so as to be pivotable about a pivot axis and a resonator end mirror is mounted on the tuning arm and adjustment means are provided for adjusting the position of the tuning arm and of the distance of the end mirror surface plane from the pivot axis of the tuning arm and the refraction grid is supported so as to be pivotally and laterally adjustable for the adjustment of the distance between the grid surface plane and the pivot axis of the tuning arm to permit compensation of the chromatic dispersion of higher than the first order.

14 Claims, 6 Drawing Sheets

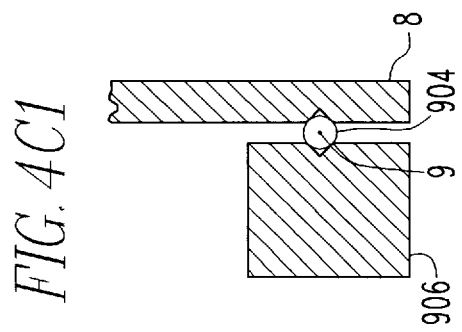
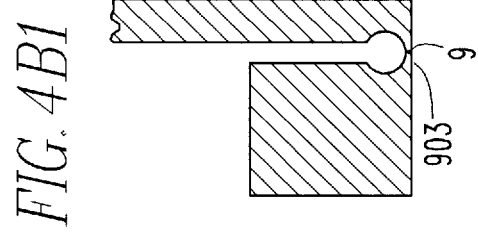
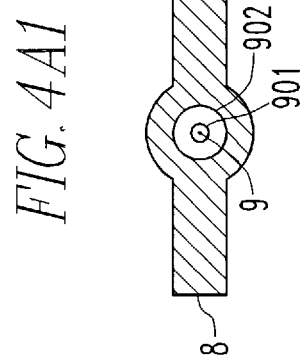
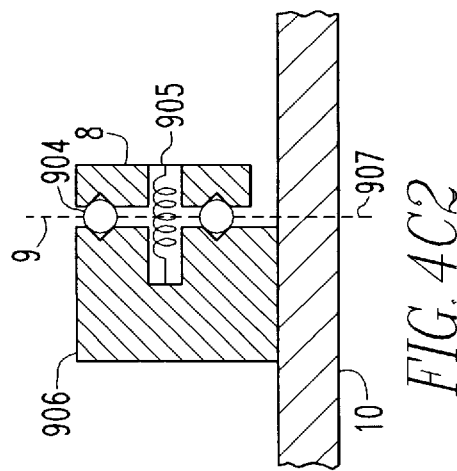
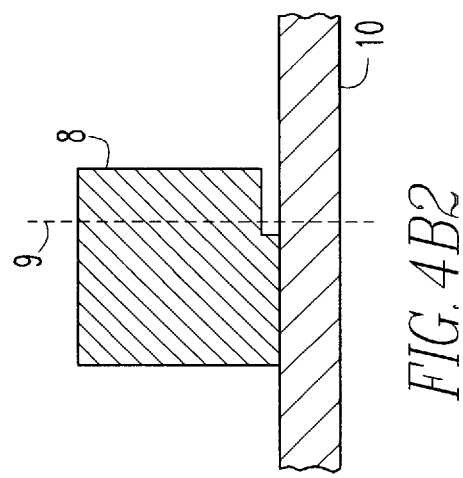
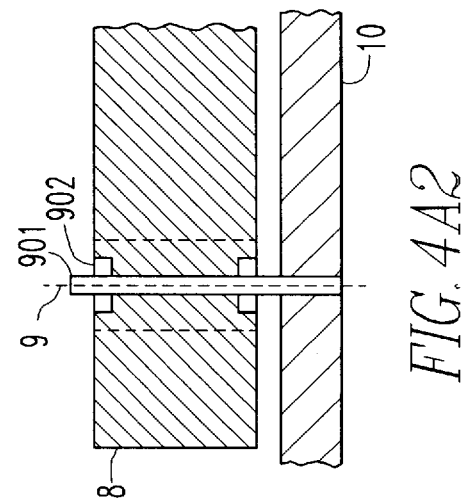

TUNING ARRANGEMENT FOR A SEMICONDUCTOR DIODE LASER WITH AN EXTERNAL RESONATOR

BACKGROUND OF THE INVENTION

The invention relates to a tuning arrangement for a semiconductor diode laser with external resonator in a Littman arrangement which includes an optical transmission component, an optical refraction grid, a rotatable tuning arm having a resonator end mirror mounted thereon and control means for controlling the position of the tuning arm and the distance between the mirror plane and the axis of rotation of the tuning arm for compensating the chromatic dispersion of the components contained in the laser.

With a semiconductor diode operated in flow direction coherent light can be generated and emitted by means of stimulated emission. The wavelength of the emitted laser light is determined by the respective stoichiometry and the microscopic structure of the semiconductor laser material. Typical emission wavelengths are between 630 nm and 1550 nm.

For some semiconductor laser applications, it is necessary to install optical elements in the laser resonator for which an external resonator is used. The light emitted from a laser facet is collimated and is back-coupled into the semiconductor laser by means of a separate (external) resonator end mirror. The laser facet directed toward the external resonator usually has an anti-reflection coating in order to provide for better coupling of the external resonator with the semiconductor laser.

With an external resonator which includes a wavelength-selective element such as an optical deflection grid, the emission wavelength can be adjusted over the amplification range of the laser. Typical band widths are between 12 nm and 120 nm depending on the use of semiconductor laser diodes with an emission wavelength of 630 nm or one with an emission wavelength of 1,550 nm.

Two typical arrangements for laser resonators which include wavelength-selective elements are the Littrow- and the Littman arrangement. A resonator is called a Littrow arrangement if it includes an optical deflection grid as a resonator end mirror wherein the directions of the incoming light and of the light which is dispersely reflected from the grid grooves and positively interferes, coincide. A folded resonator with deflection grid disposed between the resonator end mirrors is called a Littman arrangement. In this arrangement, the grid is positioned within the resonator in such a way that the first refraction order of the grid is on the resonator end mirror. The zero refraction order of the grid can then be used as operating beam of the laser. Consequently, the grid has a double function as a wavelength selective element and as an uncoupling element.

The Littman arrangement has the advantage that the illuminated grid area is larger, by a factor of 4 to 7, than that of the Littrow arrangement. As a result, the spectral selectivity of the grid is increased by the same factor so that, with a relatively large resonator length, the Littman arrangement guarantees single mode laser emissions and consequently achieves very small line widths. Another advantage is that commercially manufactured semiconductor lasers are often available only in housings which provide no access to the rear facet which is needed in the Littrow arrangement as an uncoupling mirror.

If during tuning of the emission wavelength of the laser system the resonator length is maintained constant, then the number m of nodal points of the standing light wave in the resonator changes what is termed a mode-hop. Consequently, the wavelength cannot be continuously tuned, but it leaps in discrete steps. As a result, it is difficult to tune in a desired wavelength and there may also be substantial fluctuations in the output power of the laser. Mode-hops can be avoided by varying the optical resonator length $L_{opt}$ during wavelength tuning in such a way that the wavelength $\lambda_R$ provided thereby is adjusted to the wavelength $\lambda_G$ determined by the grid. In terms of an equation, the condition:

$$\left| \frac{L_{opt}}{L_G} - m \right| < \frac{1}{2} \qquad (1)$$

must remain fulfilled. For mode-hop-free wavelength tuning of a laser which includes no dispersive media, it has been proposed to simply rotate a resonator mirror wherein the axis of rotation is disposed in the intersection of the mirror planes of the resonator end mirror and the plane of the refraction grid. However, semi-conductor lasers have a substantial chromatic dispersion because of their light amplification mechanisms. Consequently, the geometric length $L_{geo}$ differs from the optical length $L_{opt}$. The relationship is as follows:

$$L_{opt} = n(\lambda) \times L_{geo} \qquad (2)$$

wherein $n(\lambda)$ is the fraction index of the laser material whose value depends on the emission wavelength of the semiconductor laser. For a simplification of use the equation 2 is developed in a power series expansion to:

$$L_{opt} = \left( \sum_{i=0}^{\infty} n_i \times \Delta L^i \right) \times L_{geo} \qquad (3)$$

$$n_i = \frac{d^i n(\lambda_0)}{d\lambda^i}$$

$$\Delta_\lambda = \lambda - \lambda_0$$

$\lambda_0$ = development point

Mode-hop-free wavelength tuning of semiconductor lasers with external resonators is possible over large wavelength ranges only by taking the chromatic dispersion into consideration. A measure for the equalizing quality is the number i up to which the development coefficients $n_i$ can be taken into consideration. One speaks of "compensation of the dispersion of the $j^{th}$ order" when the terms $n_i$ including the term $n_j$ are exactly taken into consideration. A mode-hop-free wavelength tuning of semiconductor lasers with an external resonator over ranges larger than 60 nm to 80 nm is generally only possible if the dispersion of the $2^{nd}$ order is taken exactly into consideration and the dispersion of the $3^{rd}$ order is at least approximately taken into consideration.

An example for the compensation of the chromatic dispersion of all components of a semiconductor laser system-comprising semiconductor laser, a collimation lens system and an air-filled external resonator is described in a publication by Favre, LeGuen, "82 nm of continuous tunability for an external-cavity semiconductor laser", Electronics letters 27(2), pages 183–184, Jan. 17, 1991. Favre presents a semiconductor laser with a Littrow arrangement wherein, by means of an adjustment screw, the global chromatic dispersion of the semiconductor laser, of the imaging lens system and of the air in the external resonator can be compensated for, but only the dispersion of the first order. Furthermore, a mode-hop free wavelength tuning is not possible over the full amplification range of the laser; there are rather mode-hops which is the result of insufficient compensation for the contributions of the second and higher orders of the chromatic dispersion of the laser system.

Another example for the compensation of the chromatic dispersion of all the components of a semi-conductor laser system consisting of a semiconductor laser, a collimation lens system and an air-filled external resonator is described in WO94/08371. In this case, a semiconductor laser with a Littman arrangement is utilized wherein the axis of rotation of the mirror arm is so selected that the chromatic dispersion of the first order can be accurately compensated whereas for the dispersion of the second order a non-adjustable preset state is selected. As a result, a mode-hop free wavelength tuning over the full tuning range of the laser system is not possible.

It is the object of the present invention to provide a means for the generation of coherent light with continuous and rapidly tunable wavelength with small spectral line width. Particularly, a tuning arrangement for a semiconductor laser with external resonator is to be provided which facilitates mode-hop free wavelength tuning over the full amplification range of semiconductor lasers with a Littman arrangement.

SUMMARY OF THE INVENTION

In a tuning arrangement for a semiconductor diode laser, which includes in a Littman arrangement, an external resonator, an optical collimator lens system and an optical refraction grid, a tuning arm is supported on a tuning table so as to be pivotable about a pivot axis and has a resonator end mirror mounted thereon, and adjustment means are provided for adjusting the position of the tuning arm and of the distance of the end mirror surface plane from the pivot axis of the tuning arm, and the refraction grid is supported so as to be pivotally and laterally adjustable for the adjustment of the distance between the grid surface plane and the pivot axis of the tuning arm to permit compensation of the chromatic dispersion of higher than the first order.

With the arrangement according to the invention, a rotation of the tuning arm results at the same time in a translation and a rotation of the resonator end mirror. With its movement, the geometric resonator length $L_{geo}$ is changed and consequently, in accordance with the equations (2) and (3), also the optical resonator length $L_{opt}$ and also the wavelength $\lambda_R$ which is determined by the resonator are changed. The rotation of the resonator mirror results in a change in the wavelength $\lambda_G$ which is determined by the grid. This is achieved in accordance with the invention in such a way that the equation (1) remains always fulfilled by synchronizing the change of the optical resonator length $L_{opt}$ with the change of the wavelength $\lambda_G$ determined by the grid.

It is quite important that there is a separate tuning means for the equalization of the chromatic dispersion of each order. In this manner, each particular setting can be optimized with an easily operable functioning means.

In comparison to the arrangement disclosed in WO94/08371, the tuning arrangement according to the present invention represents a substantial advance in the art. In WO94/08371 only a single means for compensation is provided by which only the chromatic dispersion of the first order can be compensated for. A non-adjustable preset correction is provided for the chromatic dispersion of the second order. However, since the refraction index of semiconductors is a complicated function of the wavelength, it is necessary to take at least the contribution of the third order of the chromatic dispersion ($n_3$) into consideration if a sufficiently accurate compensation in the amplification range of the semiconductor lasers is to be achieved. If this is not done the upper limit of the mode-hop free tuning range is in the area of 60 nm to 80 nm. With the present invention a mode-hop free wavelength tuning over the whole amplification range of semiconductor laser diodes is achievable since an exact compensation is provided for the dispersion of the second order and an almost exact compensation is provided for the dispersion of the third order.

Preferably an adjustment means is provided for setting the distance between the axis of rotation and of the mirror plane for the translation of the resonator end mirror in the direction normal to the mirror surface. Such adjustment is preferably provided by a large-diameter finely threaded screw on which the mirror is so mounted that a line extending perpendicularly to the mirror surface extends parallel to the axis of the screw. It is advantageous if such a resonator end mirror is a rectangular prism of such a size that the light beam coming from the grid enters the prism by way of the hypotenuse surface and experiences total reflection in succession at the two cathetus surfaces and then leaves the prism again by way of he hypotenuse surface, wherein the intersection line of the prism cathetus surface extends normal to grooves of the grid. Because of this orientation of the prism, an optimal quality of the laser resonator without detrimental effect on the wavelength selectivity of the grid is obtained. Consequently, the resonator is, to a large extent, insensitive with respect to adjustment errors so that the laser can be used under rough every day conditions.

In another embodiment a cylindrical lens is disposed between the grid and the resonator mirror in such a way that the longitudinal axis of the cylindrical lens extends about normal to the grooves of the grid and that the mirror plane of the resonator end mirror is disposed in the focal plane of the cylinder lens. In that case, the resonator is also highly insensitive to adjustment errors.

It is quite advantageous if the grid is mounted on a grid support with two degrees of freedom for adjustment. The grid support is preferably rotatable by adjustment means in two directions of rotation wherein the axes of rotation are disposed perpendicularly to one another. A first rotational adjustment is preferably around on axis of the grid support which permits adjustment of the resonator quality. A second rotational adjustment is around an axis of the grid support whereby the entrance angle of the light emitted by the semiconductor diode laser and reaching the grid can be adjusted. With the first axis of rotation being parallel to the grid grooves and the second axis of rotation being perpendicular to the first axis, the two axes define a plane which is parallel to the grid plane. Such an arrangement provides for an easy and reliable adjustment.

To permit the distance between the grid plane and the axis of rotation of the tuning arm to be changed the grid support with the grid is preferably mounted on a support table. Such an arrangement is very stable. As adjusting means for the translation of the grid and the grid support on the table preferably in the direction perpendicularly to the grid, there is a finely threaded screw which permits very accurate distance adjustment.

The invention also comprises a combination with a two-dimensional arrangement for the adjustment and compensation of the chromatic dispersion of higher order whereby the grid is mounted on a grid support in such a way that it can be pivoted and the grid support is disposed on a support table such that the distance of the grid with respect to the axis of rotation of the tuning arm is adjustable. In this way an operating plane is provided in which the necessary compensation adjustments can be rapidly and effectively performed.

It is further advantageous if, for an adjustment and compensation of the chromatic dispersion of higher order, the grid is mounted on a grid support in such a way that the incidence angle on the grid of the light emitted by the semiconductor laser is adjustable. For this purpose, the grid support is so mounted on the support table that the distance between the grid plane and the pivot axis of the tuning arm is adjustable. The three important adjustment possibilities are combined in this way in a simple and clear manner.

The invention will be described below in greater detail on the basis of the accompanying drawings.

BRIEF DESCRIPTION OF THE DRAWINGS

FIGS. 4A1, 4B1, and 4C1 are schematic side views of various pivot arrangements, FIGS. 4A2, 4B2, and 4C2 are schematic top views of the arrangements shown in FIGS. 4A1, 4B1 and 4C1 respectively.

DESCRIPTION OF PREFERRED EMBODIMENTS

Figure 1A:
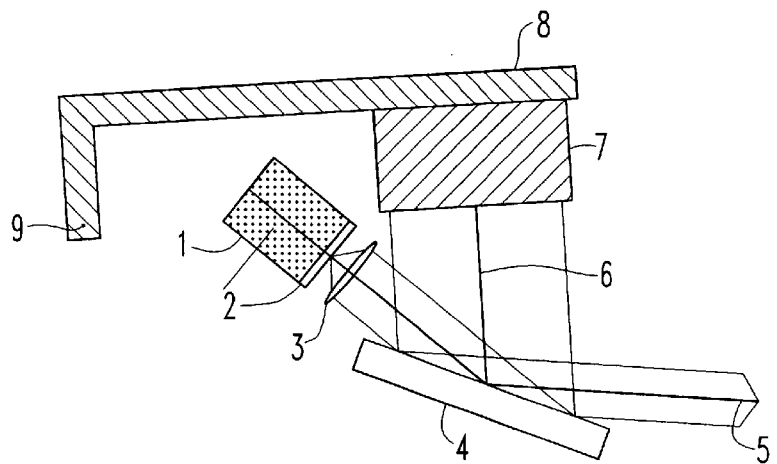
FIG. 1A is a schematic representation of a basic tuning arrangement.

FIG. 1A shows a semiconductor laser diode with external resonator in a Littman arrangement. It includes a semiconductor laser 1 with a mirror facet provided with an anti-reflection coating 2 and directed toward the external resonator. A lens 3 collimates the laser light which is emitted from the mirror facet and which is directed onto the surface of a refraction grid 4 under an incident angle $\Theta 1$. Light of the zero refraction order is uncoupled from the laser as a laser beam 5. Light of the first refraction order is directed onto the external resonator end mirror 7, is reflected there and, after having been refracted by the grid 4 a second time, is recoupled into the laser 1. The end mirror 7 is mounted on a tuning arm 8 which is supported so as to be rotatable about a pivot axis 9 which is parallel to the mirror plane 701. If the tuning arm is pivoted about the pivot axis 9 the wavelength $\gamma_G$ determined by the grid 4 changes and, at the same time, also the wavelength $\gamma_R$ determined by the resonator length.

Figure 1B:
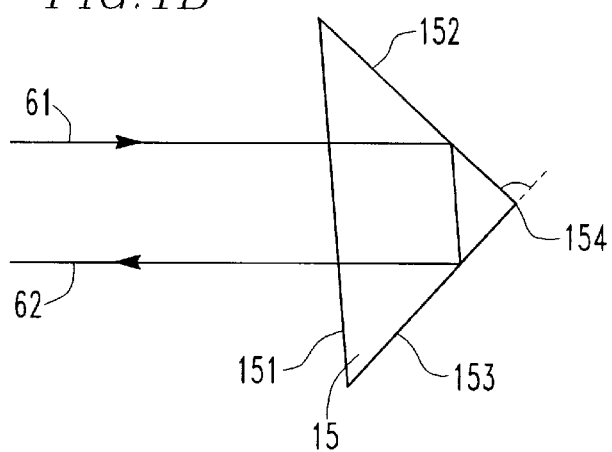
FIG. 1B shows the beam path in a prism.

FIG. 1B shows a prism 15 in cross-section. The cross-sectional plane is defined by two catheti 152 and 153 which intersect at 90°. A beam 61 coming from the grid 4 enters the prism 15 through the hypotenuse surface 151 is totally reflected at the catheter surface 152 and then at the catheter surface 153 and leaves the prism 15 again through the hypotenuse surface 151. The incident beam 61 and the exiting beam 62 are parallel but oppositely directed with respect to each other. When the exiting beam 62, after inflection at the grid 4, reaches the collimator lens 3, it is again coupled into the semiconductor laser 1 essentially independently of its angle with the hypotenuse surface 151.

Figure 1C:
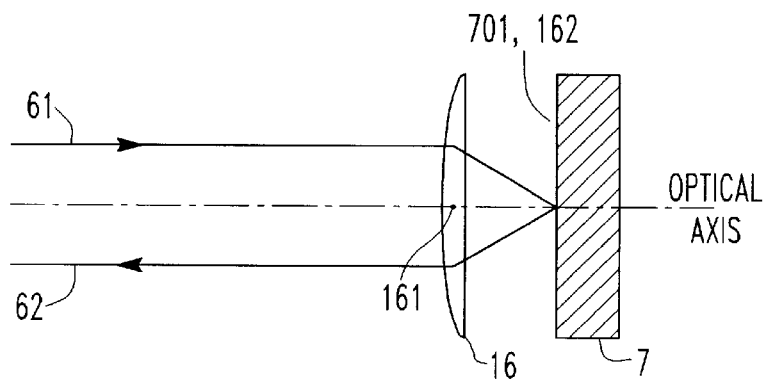
FIG. 1C shows the beam path with a cylindrical lens and a mirror arrangement.

FIG. 1C is a cross-sectional view through the cylindrical lens 16 and the resonator end mirror 7 wherein the sectional plane extends normal to the mirror plane 701 and to the longitudinal axis 162 of the cylinder lens 16. A beam which comes in this plane from the grid 4, and which is parallel to this optical axis of the cylinder lens is inflected toward the optical axis of the cylindrical lens 16, is then reflected at the mirror plane 701 back toward the cylindrical lens 16 where it is again inflected. The distance between the cylinder lens 16 and the mirror plane 701 is selected so as to coincide with the focal length of the cylindrical lens 16. The incident beam 61 and the exiting beam 62 are parallel but oppositely directed. When, after inflection, the exiting beam reaches again the collimator lens it is again coupled into the semiconductor laser 1 essentially independently of the angle of the mirror plane 701 with respect to the incident and exiting light beams 61 and 62.

Figure 2:
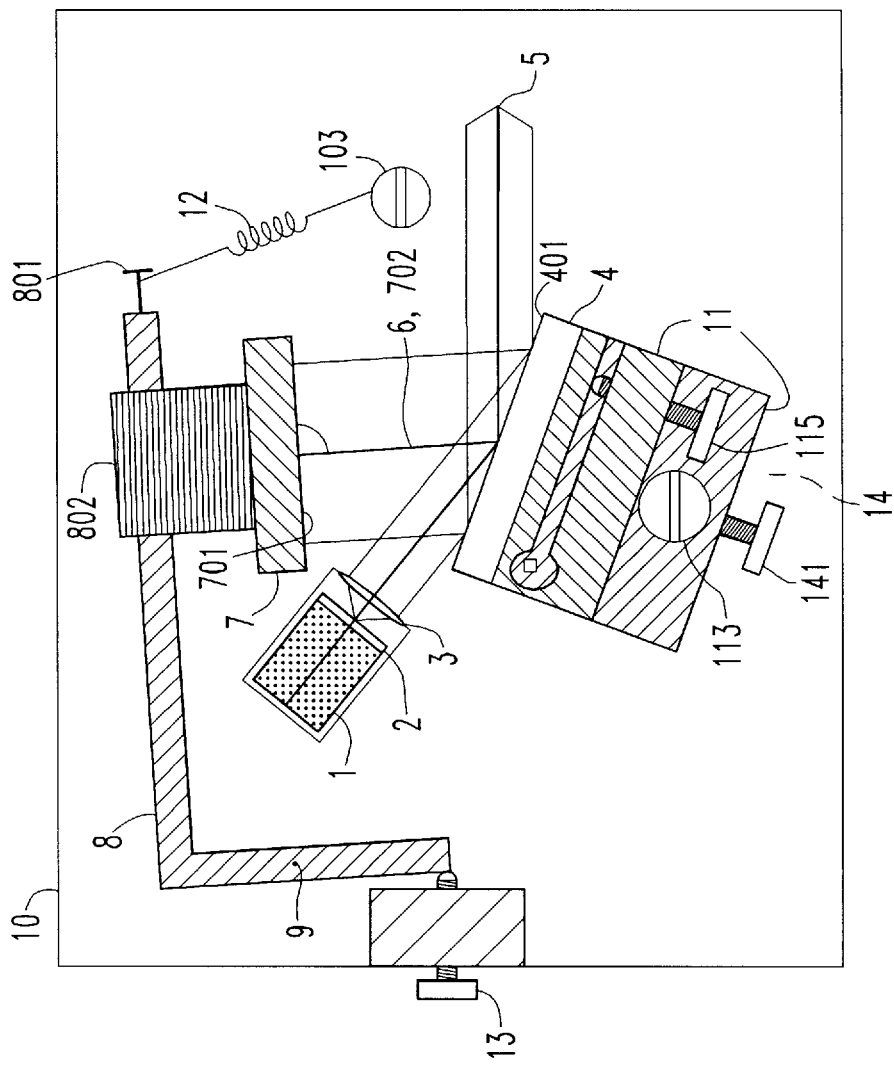
FIG. 2 shows schematically a preferred tuning arrangement.

FIG. 2 is a top view of a preferred embodiment of the tuning arrangement according to the invention. The semiconductor laser 1 which is provided at one side with an anti-reflection coating 2 is mounted, together with the collimator lens 3, on a base plate 10 on which also the grid 4 with a grid support 11 is mounted. The tuning arm 8, which carries the external resonator end mirror 7 is so mounted onto the base plate 10 that it can be pivoted only about the pivot axis 9. A return spring 12 biases the tuning arm 8 into engagement with an adjustment unit 13 which preferably comprises a micrometer screw and a piezo translator and with which the tuning arm 8 can be accurately positioned. If the micrometer screw is turned or the voltage present at the piezo translator is changed, the resonator end mirror 7 is pivoted and, at the same time, moved laterally. The pivoting changes the exit angle $\Theta 2$ (FIG. 5) of the light beam of the first inflection order, that is, of the tuning beam 6, and consequently, the wavelength $\lambda_G$ determined by the grid 4. The lateral movement (translation) changes the resonator length $L_{opt}$ and consequently the wavelength $\lambda_R$ determined thereby.

Figure 3A:
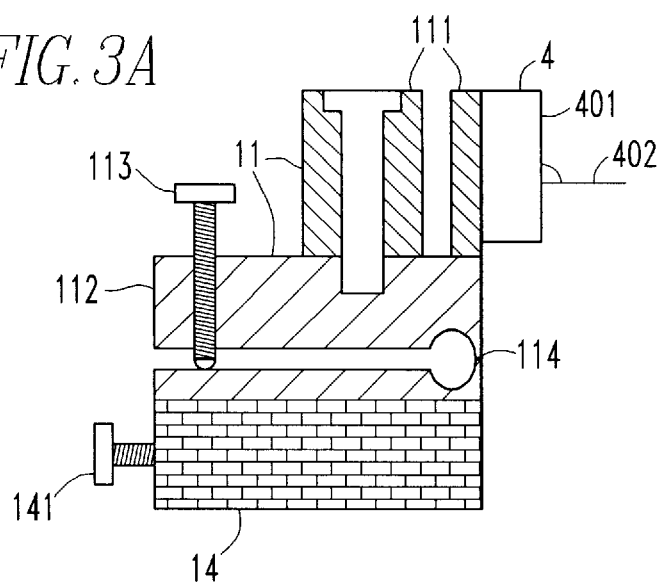
FIG. 3A shows schematically an angle adjustment arrangement.
Figure 3B:
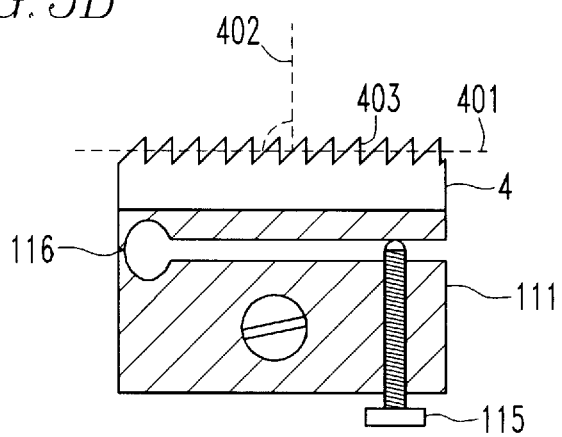
FIG. 3B shows schematically, in a side view, a grid support with adjustment means.

FIG. 2 shows further a tuning table 14 whose components are presented in greater detail in FIGS. 3A and 3B. It is apparent that the grid support 11 comprises an upper part 111 and a lower part 112 which are screwed together and are mounted on the table 14. The lower part 112 of the grid support 11 is a bending element which can be pressed apart by a finely threaded screw 113. By rotation of the screw 113, the grid 4 is pivoted about an axis 114 which is essentially parallel to the grid grooves 403. This adjustment possibility permits the tuning of the resonator quality.

The tuning table 14 has further a finely threaded screw 141 rotation of which results in a translation of the grid support 11 and of the grid 4 in a direction which essentially corresponds to the direction of a line 402 normal to the grid 4. This degree of freedom of adjustment serves to set the mode-hop-free wavelength tuning range.

FIG. 3B is a cross-sectional view of the upper part 111 of the grid support 11 (see FIG. 3A). The upper part 111 is also a bending element which is pressed apart by a finely threaded screw 115 rotation of which results in pivoting of the grid 4 about an axis 116 parallel to the grid grooves 403. This also contributes to the adjustment of the maximal mode-hop free wavelength tuning range. If the adjustment of the grid support 11 and of the tuning table 14 are performed at one time they do not need to be readjusted during the rest of the tuning procedure.

FIG. 2 and FIGS. 4A1, 4B1, 4C1, 4A2, 4B2, and 4C2 show possible embodiments for the tuning arm 8. As shown in FIG. 2, the tuning arm 8 carries a screw 801 to which a return spring 12 is connected. The resonator end mirror 7 is mounted on a large diameter, finely threaded screw 802 which is screwed into the tuning arm 8 and by whose rotation the mirror 7 can be moved laterally in the direction of a line 702 normal to the mirror surface. Once the tuning arm 8 is adjusted its adjustment can remain unchanged for the rest of the tuning procedure.

Figure 6:
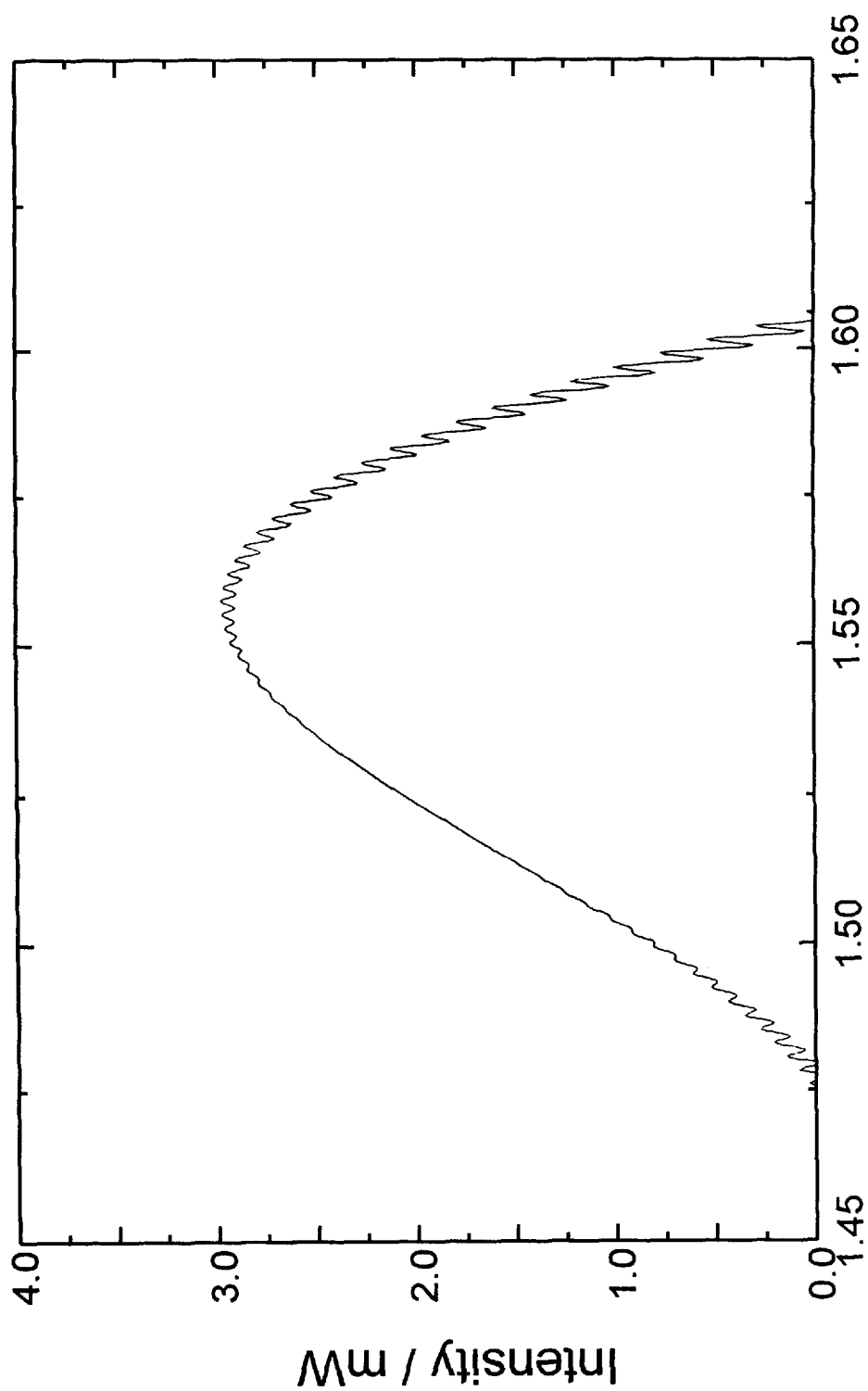
FIG. 6 is a diagram of laser beam intensity in dependence on the wavelength.

A particular design possibility is shown in FIG. 4A1 and 4A2. In this case, the pivot axes 9 is a metal rod 901 by which the tuning arm 9 is pivotally supported on the base plate 10 by way of a bearing 902. In the embodiment of FIGS. 4B1 and 4B2, the tuning arm 8 is also supported on the base plate 10, but it is provided with a restriction 903 which serves as pivot axis 9. FIGS. 4C1 and 4C2 show a tuning arm 8 which is connected by two balls 904 and a spring 905 with a rod 906 which again is mounted on the base plate 10. In this case, the pivot axis 9 is disposed in the connecting line 907 between the center points of the balls 904. It can be seen that all these variations provide for a high-precision, practically play-free pivot movement of the tuning arm as it is required for a mode-hop free wavelength tuning of the laser 1. As apparent from FIG. 6, wherein the laser beam intensity is diagrammatically shown in dependence on the wavelength, there is in the measurement example presented, a mode-hop free curve shown over a wavelength range of 130 nm which represents a doubling of the range when compared with the state of the art.

Below, the operation of the tuning arrangement according to the invention is further described on the basis of FIG. 5. It can be seen that the distance $x_2$ between the pivot axis 9 and the mirror surface 701 is adjustable. The mirror surface defines lines which extend parallel to the axis 9 so that the geometric term definition for the distance between a point and a straight line can be used in the common way. By laterally moving the resonator end mirror 7 by means of screw 802 in the direction of a line normal to the mirror 7 the resonator length $L_{geo}$ is changed without changing thereby the wavelength $\lambda_G$ as determined by the grid 4. Such adjustment movement accordingly permits to change exclusively the number of nodes n of the standing waves in the laser resonator. Rotation and translation of the resonator mirror 7 are so synchronized that the wavelength $\lambda_G$ determined by the grid and the wavelength $\lambda_R$ determined by the resonator length $L_{opt}$ are different by less than a quarter of the wavelength (see equation (1)). Since the refraction index of semiconductor lasers—in contrast for example to a gas or coloring agent laser—has a substantial chromatic dispersion, the geometric length $L_{geo}$ according to equation (3) differs substantially from the optical length $L_{opt}$. The adjustment means present in the tuning arrangement according to the invention facilitates the compensation in a surprisingly simple and reliable manner. The adjustment screw 801 serves for the compensation of the dispersion of the first order of all the components contained in a laser resonator (semiconductor laser 1, outer reflection coating 2, collimator lens 3, air). By means of the finely threaded screw 141, the dispersion of the second order can be accurately compensated. The finely threaded screws 115 permit the compensation of the dispersion of the third order and a pre-selection of the compensation for the dispersion of the fourth order.

Figure 5:
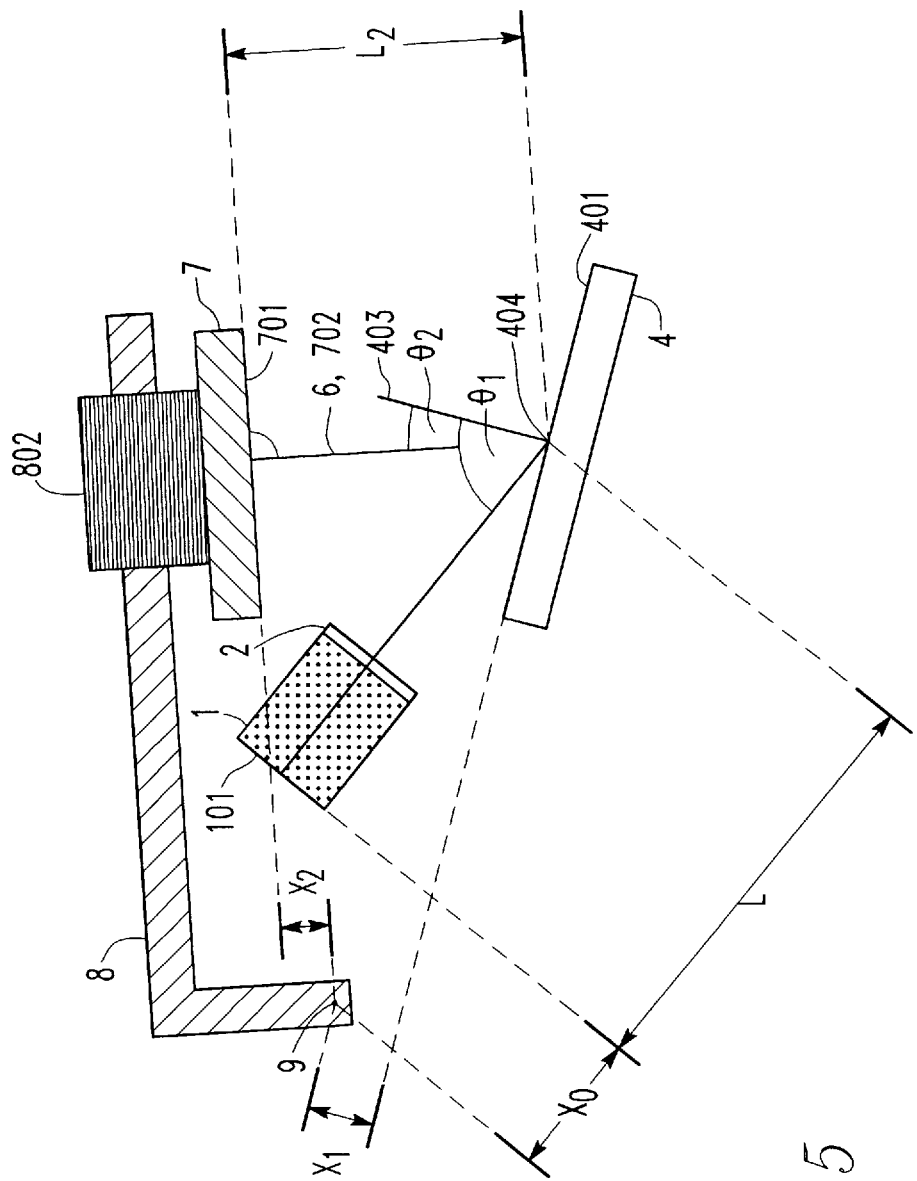
FIG. 5 shows schematically the optical conditions of the complete arrangement.

In FIG. 5, the relevant optical-geometrical sizes are schematically presented; $\Theta_1$ designates the incident angle onto the grid 4 of the light emitted by the laser 1, this angle can be adjusted by means of the screw 115; $x_1$ designates the distance between the grid plane 401 and the pivot axis 9 of the tuning arm 8. The distance is adjustable by lateral movement of the grid 4 in the direction of a line 702 normal to the grid surface 701 which is done by rotating the adjustment screw 141 of the tuning table 14 which results in a translation of the grid support 11 and of the grid. Small angle differences between the direction of translation and the direction of the line 702 as they may occur by the rotation of the grid 4 about the axes 116, 115 do not disturb the adjustment of the distance $x_1$.

$X_2$ designates the distance between the mirror plane 701 and the pivot axis 9 of the tuning arm 8. It is adjustable by means of the screw 802. The geometric resonator length $L_1$ is the geometric distance between the resonator end face 101 and the center 404 of the illuminated area of the grid 4. The partial length $L_2$ is given by the geometric distance between the mirror plane 701 and the center 404 of the illuminated area of the grid 4. In accordance with the equations (2) and (3), there is consequently the following relationship:

$$L_{opt}=n(\lambda)\times(L_1+L_2).$$

This description of the dispersion of the semiconductor material can be easily expanded to cover the dispersion of all the media contained in the resonator, for example, by weighting the refraction index functions in accordance with their length and adding them up. The global dispersion of all the media contained in a resonator results in a difference between the resonator wavelength $\lambda_R$ and the grid wavelength $\lambda_G$ which can be described by a serial development as follows:

$$\lambda_R-\lambda_G=f_1\times\Delta\lambda=f_2\times\Delta\lambda^2+f_3\times\Delta\lambda^3+ \ldots$$

$f_i$=development coefficient $\Delta\lambda=\lambda_G-\lambda_O$ $\lambda_O$=development point Specifically $f_1$, $f_2$, $f_3$ are functions of the adjustment values $\Theta_1$, $x_1$ and $x_2$. Based on them the value of the development coefficients can be selected which will be given below in the order of the tuning procedure for the laser resonator.

$X_2$: the value of $x_2$ which is selected by adjustment of the adjustment screw 802 of the tuning arm 8 permits the accurate compensation for the development coefficient $f_1$.

$X_1$: The value of $x_1$ which is selected by adjustment of the adjustment screw 141 of the tuning table 14, on which the grid support 11 together with the grid 4 is mounted, permits the accurate compensation for the development coefficient $f_2$.

$\Theta_1$: The value of the incident angle $\Theta_1$ at the grid 4 is adjustable by means of the adjustment screw 115 in a sufficiently large range. It permits the accurate compensation for the development coefficient $f_3$.

It is quite apparent that the tuning arrangement according to the invention, in spite of being quite rugged, can be operated in a very sensitive manner and it makes it possible to tune the emission wavelength of semiconductor lasers in a mode-hop free fashion over the full amplification range. Calculation values for the tuning range are by multiples above the amplification range of semiconductor lasers. Consequently, there is also a large tolerance range for the selection of values for the various adjustment means (802, 141, 115) by which the tuning procedure can be attended to in a fast and safe manner.

In this procedure, the resonator quality is insensitive with regard to external disturbances which could result in tuning errors. The wavelength tuning behavior and the spectral selectivity of the grid resonator, during pivoting of the tuning arm 8 about the pivot axis 9 remain unchanged.

The invention is not limited to the examples shown and described herein but it may be modified in various ways. It can however, be seen that, in a preferred embodiment of a semiconductor diode laser 1 with an anti-reflection coating 2, a collimator lens 3, a reflection refraction grid 4 and a resonator end mirror 7 in a Littman arrangement, the beam exit angle $\Theta_2$ of the grid and the geometric resonator length $L_{geo}$ are mechanically intertwined so as to compensate for the global chromatic dispersion of all the media contained in the resonator (the semiconductor diode laser 1, the reflection coating 2, the collimator lens system 3 and the air) when the mirror 7 is pivoted about the pivot axis 9 in such an accurate way that a compensation for at least the dispersions of the first, the second and the third order is achieved with the aid of adjustment means 802, 141, 115. In this way, a mode-hop free wavelength tuning over the full amplification range of the semiconductor diode laser 1 is safely obtained.

What is claimed is:

1. A tuning arrangement for a semiconductor diode laser having an anti-reflection coating and including an external resonator in a Littman arrangement, comprising at least one optical collimator lens system, an optical refraction grid, a tuning arm supported so as to be pivotable about a pivot axis, a resonator having a variable length and an end mirror with a mirror surface mounted on said tuning arm and adjustment means for adjusting the position of said tuning arm and the distance between the surface plane of said resonator end mirror and the pivot axis of said tuning arm for the compensation of the chromatic dispersion of the first order of all the components contained in the laser wherein the resonator length $L_{geo}$ and the angular position relationship between said grid and said end mirror are mechanically intertwined such that, for an adjustment and compensation of the chromatic dispersion of higher orders, said grid is supported so as to be pivotally adjustable and also laterally adjustable for an adjustment of the distance between the grid surface plane and the pivot axis of said tuning arm.

2. An arrangement according to claim 1, wherein, for the compensation of the chromatic dispersion of a number of orders, there is an adjustment means for the compensation of each order.

3. An arrangement according to claim 1, wherein, for the adjustment of the distance between the pivot axis of the tuning arm and the mirror plane of the resonator end mirror, said resonator end mirror is supported on said tuning arm so as to be laterally movable and an adjustment means is provided by which said resonator end mirror is adjustable in a direction normal to the resonator end mirror surface.

4. An arrangement according to claim 3, wherein said adjustment means is a relatively large diameter, finely threaded adjustment screw threaded into said tuning arm and supporting said resonator end mirror in a plane normal to the axis of said adjustment screw so that, by rotation of said adjustment screw, said mirror is moved along the axis of said adjustment screw.

5. An arrangement according to claim 1, wherein said resonator end mirror comprises a rectangular prism having a hypotenuse surface and two cathetus surfaces of such a size that a light beam coming from said grid enters said prism through said hypotenuse surface is totally reflected on one and then on the other cathetus surface and then leaves the prism through the hypotenuse surface, said prism being arranged such that a line of intersection between said cathetus surfaces extends normal to grooves formed in said grid.

6. An arrangement according to claim 1, wherein a cylindrical lens is disposed between said grid and said resonator mirror, said grid having grooves and said cylindrical lens having an axis which extends essentially normal to said grooves of said grid and said resonator mirror having a mirror plane disposed at a distance from said cylindrical lens equal to the focal length of said cylindrical lens.

7. An arrangement according to claim 1, wherein said grid is mounted on a grid support with two degrees of freedom of movement.

8. An arrangement according to claim 7, wherein said grid support is pivotable about two pivot axes which extend normal to one another and adjustment means are provided for adjusting the grid support pivot positions.

9. An arrangement according to claim 8, wherein adjustment of said grid support about one of said pivot axes affects the resonator quality.

10. An arrangement according to claim 9, wherein adjustment of said grid support about the other pivot axis permits a change of the incident angle $\Theta$ on the grid of the light emitted by the semiconductor diode laser.

11. An arrangement according to claim 8, wherein the distance $x_1$ between the grid plane and the pivot axis of the tuning arm is adjustable by movement of the grid support together with said grid on an adjustment table on which said grid support is laterally movably supported.

12. An arrangement according to claim 11, wherein a finely threaded adjustment screw is provided to effect the lateral adjustment movement of said grid on said adjustment table.

13. A tuning arrangement for a semi-conductor diode laser having an anti-reflection coating and including an external resonator in a Littman arrangement, comprising at least one optical collimator lens system, an optical refraction grid, a tuning arm supported on a tuning table so as to be pivotable about a pivot axis, a resonator end mirror mounted on said tuning arm and adjustment means for adjusting the position of the tuning arm and of the distance $x_2$ between the mirror surface plane of said resonator end mirror and said pivot axis of said tuning arm for the compensation of the chromatic dispersion of the first order for all the components contained in the laser wherein the changes of the geometric resonator length and the angular position relationship between the grid and the end mirror are mechanically intertwined by a two-dimensional arrangement for the adjustment and the compensation of the chromatic dispersion of higher orders such that said grid is pivotally mounted on a grid support which is supported on said tuning table in such a way that said grid is movable for changing its distance from the pivot axis of said tuning arm.

14. A tuning arrangement for a semiconductor diode having an anti-reflection coating and including an external resonator in a Littman arrangement, comprising at least one optical collimator lens system, an optical refraction grid, a tuning arm supported on a tuning table so as to be pivotable about a pivot axis, a resonator end mirror mounted on said tuning arm, and adjustment means for adjusting the position of said tuning arm and the distance $x_2$ between the mirror surface plane of said resonator end mirror and said pivot axis of said tuning arm for the compensation of the chromatic dispersion of the first order for all components contained in the laser wherein the changes of the geometric resonator length and the angular position relationship between the grid and the end mirror are mechanically intertwined such that for the adjustment and compensation of the chromatic dispersion higher orders the grid is pivotally mounted on a grid support such that the incident angle $\Theta$ on the grid of light emitted from the semiconductor diode laser is adjustable and said grid support is mounted on said tuning table in such a way that the distance $x_1$ between a grid front surface plane and the pivot point of said tuning arm is adjustable.

* * * * *